United States Patent
Higashikawa et al.

(10) Patent No.: US 9,519,008 B2
(45) Date of Patent: Dec. 13, 2016

(54) ELECTRONIC DEVICE

(71) Applicant: KABUSHIKI KAISHA TOYOTA JIDOSHOKKI, Kariya-shi, Aichi-ken (JP)

(72) Inventors: Naoki Higashikawa, Kariya (JP); Kazuyoshi Kontani, Kariya (JP)

(73) Assignee: KABUSHIKI KAISHA TOYOTA JIDOSHOKKI, Aichi-ken (JP)

( * ) Notice: Subject to any disclaimer, the term of this patent is extended or adjusted under 35 U.S.C. 154(b) by 32 days.

(21) Appl. No.: 13/929,101

(22) Filed: Jun. 27, 2013

(65) Prior Publication Data

US 2014/0002054 A1    Jan. 2, 2014

(30) Foreign Application Priority Data

Jun. 29, 2012  (JP) ................................. 2012-147171

(51) Int. Cl.
*G01R 1/04* (2006.01)
*H05K 3/30* (2006.01)
(Continued)

(52) U.S. Cl.
CPC ................ *G01R 1/04* (2013.01); *H05K 3/301* (2013.01); *H05K 7/1432* (2013.01);
(Continued)

(58) Field of Classification Search
CPC ......... G01R 1/04; G01R 21/133; H05K 3/301; H05K 7/1432; H05K 1/0271; H05K 7/209; H05K 7/20927; H01R 11/287; H02M 7/003; B60K 6/26; B60K 6/405; B60K 6/48; H02P 27/06; B60W 10/08
(Continued)

(56) References Cited

U.S. PATENT DOCUMENTS

2003/0056965 A1    3/2003 Tsuchiyama
2006/0052914 A1*   3/2006 Kubokawa ........... H05K 7/1432
                                                          701/21
(Continued)

FOREIGN PATENT DOCUMENTS

JP    S53-108867    8/1978
JP    S6339922      3/1988
(Continued)

OTHER PUBLICATIONS

Communication dated May 12, 2015 issued by the Japanese Patent Office in counterpart Japanese Application No. 2012-147171.
(Continued)

*Primary Examiner* — Arleen M Vazquez
*Assistant Examiner* — Brent J Andrews
(74) *Attorney, Agent, or Firm* — Sughrue Mion, PLLC

(57) ABSTRACT

An electronic device includes a support that is coupled to a coupled subject and includes a support portion, a substrate supported by the support portion, a current sensor including a signal terminal, wherein the current sensor is connected to the substrate in a manner allowing for a signal to be sent to the substrate through the signal terminal, and a fastener fastening the current sensor to the support portion and the substrate. The current sensor is suspended from the substrate. The support portion is arranged between the substrate and the current sensor.

8 Claims, 3 Drawing Sheets

(51) Int. Cl.
*H05K 7/14* (2006.01)
*H05K 1/02* (2006.01)

(52) U.S. Cl.
CPC .......... *H05K 1/0271* (2013.01); *H05K 3/306* (2013.01); *H05K 2201/10151* (2013.01); *H05K 2201/10409* (2013.01); *H05K 2201/10424* (2013.01)

(58) Field of Classification Search
USPC ...................................................... 324/76.11
See application file for complete search history.

(56) References Cited

U.S. PATENT DOCUMENTS

| | | | |
|---|---|---|---|
| 2007/0029992 A1* | 2/2007 | Harmon et al. .......... | 324/117 H |
| 2007/0246635 A1* | 10/2007 | Nakajima ................ | B60K 6/26 248/637 |
| 2009/0030571 A1* | 1/2009 | Takayanagi ............. | B60T 8/368 701/36 |
| 2010/0207604 A1* | 8/2010 | Bitsch .................. | G01R 21/133 324/140 R |

FOREIGN PATENT DOCUMENTS

| | | |
|---|---|---|
| JP | H171490 | 5/1989 |
| JP | H242472 | 3/1990 |
| JP | 9-116284 A | 5/1997 |
| JP | 2003-086970 A | 3/2003 |

OTHER PUBLICATIONS

Communication dated Dec. 8, 2015 from the Japanese Patent Office issued in corresponding Application No. 2012-147171.

\* cited by examiner

ELECTRONIC DEVICE

BACKGROUND OF THE INVENTION

The present invention relates to an electronic device including a current sensor that is connected to a substrate to send a signal to the substrate through a signal terminal.

Japanese Laid-Open Patent Publication No. 2003-86970 describes a driving circuit 80 of an electric motor as shown in FIG. 5. The driving circuit 80 includes a drive element 81, which includes a mount base 82, a connection terminal 84, and the coupler 85. The mount base 82 is molded from a resin and accommodates an element. The connection terminal 84 is connected to a circuit board 83. The coupler 85 couples the driving element 80 to the circuit board 83. A rod-shaped spacer 86, which is made of a synthetic resin, is arranged on the circuit board 83. The coupler 85 and the connection terminal 84 are fixed to the circuit board 83. The spacer 86 is arranged between the coupler 85 and the circuit board 83. A current sensor is fastened to the driving circuit 80 with a screw for example. The current sensor detects the current value of the power converted by the driving circuit 81. The current sensor includes a signal terminal soldered to the circuit board 83.

A current sensor is larger than other circuit components. Thus, the current sensor arranged on the circuit board 83 reduces the mount area for elements on the circuit board 83. In addition, when vibration of the driving circuit 80 vibrates the current sensor, the circuit board 83, which is coupled to the current sensor, also vibrates. The current sensor and the circuit board 83 have separate resonance points. This damages the solder connection of the signal terminal.

SUMMARY OF THE INVENTION

It is an object of the present invention to provide an electronic device that includes a current sensor, yet has an increased mount area on a substrate, and reduces vibration of the current sensor.

To achieve the above object, one aspect of the present invention is an electronic device that includes a support that is coupled to a coupled subject and includes a support portion, a substrate supported by the support portion, a current sensor including a signal terminal, wherein the current sensor is connected to the substrate in a manner allowing for a signal to be sent to the substrate through the signal terminal, and a fastener fastening the current sensor to the support portion and the substrate. The current sensor is suspended from the substrate. The support portion is arranged between the substrate and the current sensor.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

Referring to FIGS. 1 to 4, one embodiment of an electronic device according to the present invention applied to a semiconductor device for an industrial vehicle will now be described.

Figure 1:
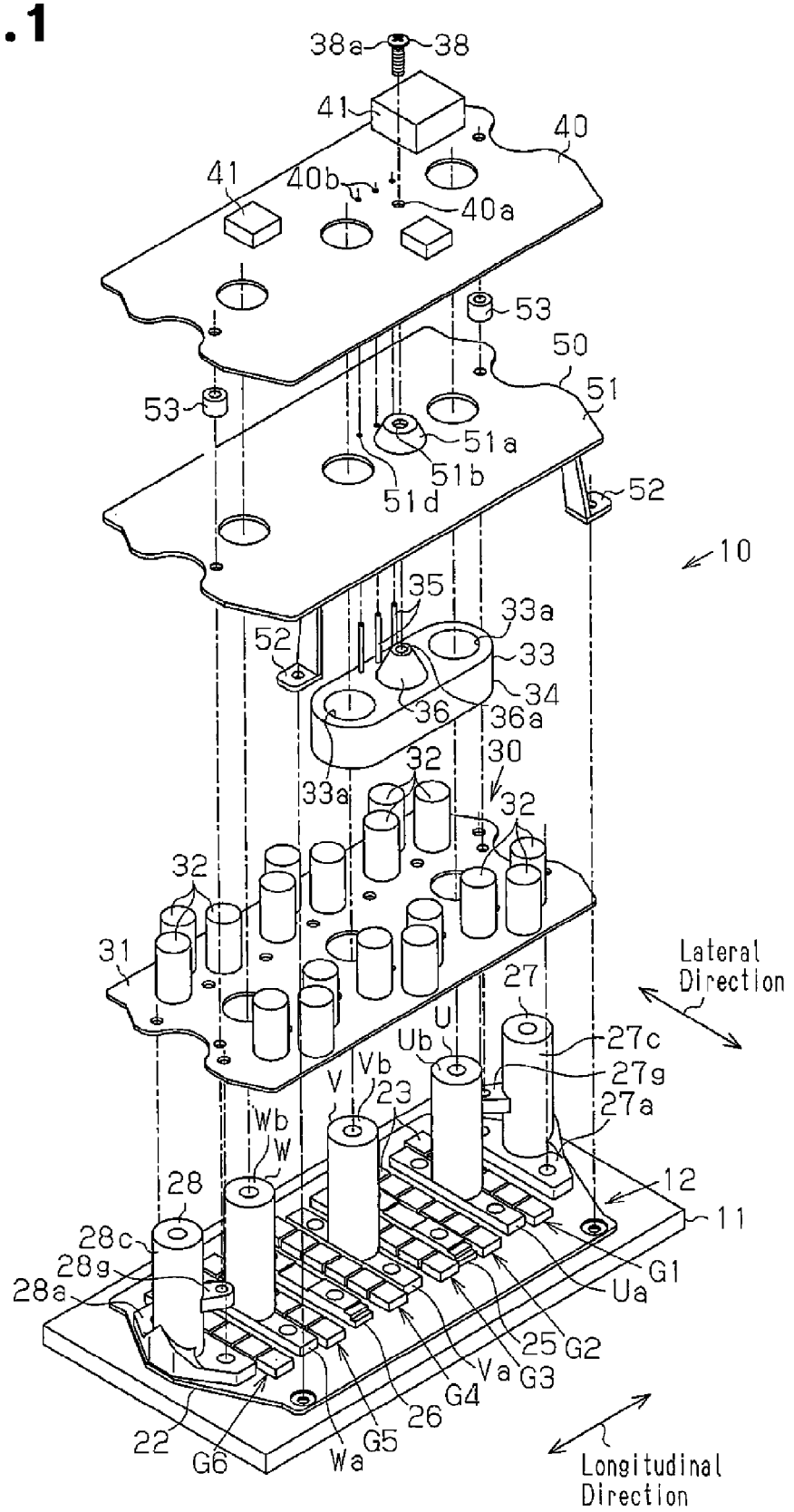
FIG. 1 is an exploded perspective view showing a semiconductor device of one embodiment.

As shown in FIG. 1, a semiconductor device 10, which serves as an electronic device, includes a heat sink 11. The heat sink 11 is a rectangular plate made of aluminum metal, copper, or the like. The heat sink 11 has an upper surface that supports a semiconductor module 12. The semiconductor module 12 includes a main circuit board 22 and a plurality of semiconductor elements 23 mounted on the main circuit board 22. The main circuit board 22 is a rectangular plate. In the following description, the direction along the longer sides of the main circuit board 22 is referred to as a longitudinal direction, and the direction perpendicular to the longitudinal direction is referred to as a lateral direction.

The main circuit board 22 includes a metal substrate, which has an upper surface covered by an insulation coating, and conductor patterns (not shown), which are formed on the insulation coating and made of copper or aluminum. The semiconductor elements 23 are soldered to the conductor patterns of the main circuit board 22. The semiconductor elements 23 are arranged in a plurality of (six) lines extending along the lateral direction of the main circuit board 22 to form element groups G1-G6. The element groups G1-G6 are laid out in the longitudinal direction of the main circuit board 22. The six element groups G1-G6 are separated into three sets. One set includes the first and second element groups G1 and G2 that form the U phase. Another set includes the third and fourth element groups G3 and G4 that form the V phase. The remaining set includes the fifth and sixth element groups G5 and G6 that form the W phase. Each of the element group G1-G6 is electrically connected to an individual conductor pattern. In addition, the semiconductor elements 23 of the element groups G1-G6 are connected to the conductor patterns in parallel.

Figure 2:
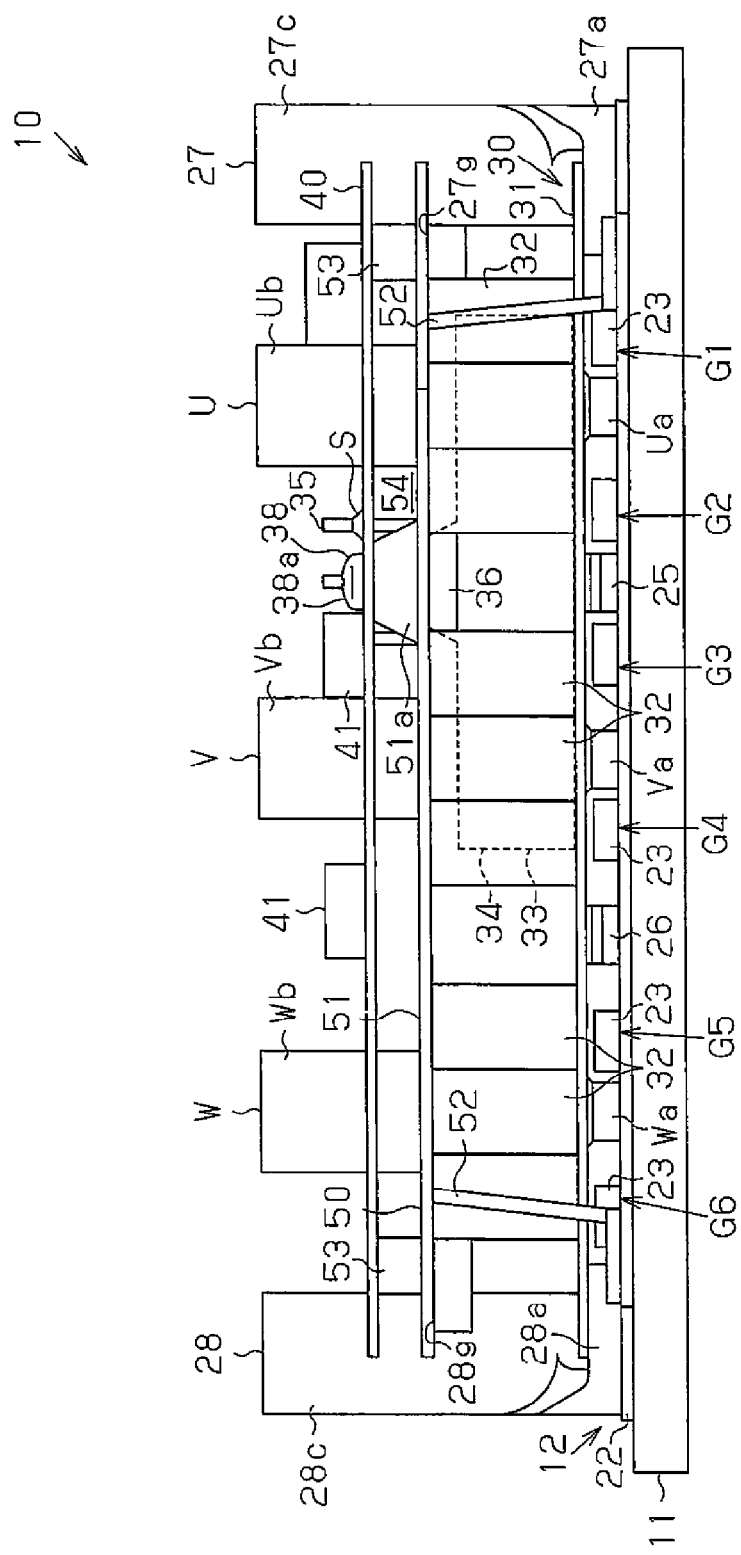
FIG. 2 is a side view of the semiconductor device of FIG. 1.

As shown in FIGS. 1 and 2, an aluminum positive input electrode 27 is arranged near one longitudinal end of the main circuit board 22, and an aluminum negative input electrode 28 is arranged near the other longitudinal end of the main circuit board 22. The positive and negative input electrodes 27 and 28 respectively include pattern connection electrode portions 27*a* and 28*a* arranged on the conductor patterns of the main circuit board 22. The positive and negative input electrodes 27 and 28 also respectively include rod-shaped external connection electrode portions 27*c* and 28*c* projecting from the longitudinally middle sections of the pattern connection electrode portions 27*a* and 28*a*. The external connection electrode portions 27*c* and 28*c* respectively include board support portions 27*g* and 28*g* projecting from the circumferential surfaces of the external connection electrode portions 27*c* and 28*c* above the pattern connection electrode portions 27*a* and 28*a*. The board support portion 27*g* and 28*g* support a control circuit board 40.

The lower surfaces of the pattern connection electrode portions 27*a* and 28*a* of the positive and negative input electrodes 27 and 28 are in planar contact with the conductor patterns. The lower surfaces of the pattern connection electrode portions 27a and 28a are also in planar contact planar contact with the heat sink 11 through the main circuit board 22. Thus, the pattern connection electrode portions 27a and 28a are thermally coupled to the heat sink 11.

The semiconductor module 12 includes a U-phase output terminal U, a V-phase output terminal V, and a W-phase output terminal W, which are connected to a vehicle drive motor of an industrial vehicle. The U-phase output terminal U is arranged between the first element group G1 (U-phase upper-arm element group) and the second element group G2 (U-phase lower-arm element group). The V-phase output terminal V is arranged between the third element group G3 (V-phase lower-arm element group) and the fourth element group G4 (V-phase upper-arm element group). The W-phase output terminal W is arranged between the fifth element group G5 (W-phase upper-arm element group) and the sixth element group G6 (W-phase lower-arm element group).

The U-phase output terminal U, V-phase output terminal V, and W-phase output terminal respectively include bases Ua, Va, and Wa, which has the shape of a rectangle plate (strip), and rod-shaped external connection terminals Ub, Vb, and Wb, which project from the longitudinally middle sections of the corresponding bases Ua, Va, and Wa. The external connection terminals Ub, Vb, Wb are connected to the vehicle drive motor.

A negative relay terminal 25 is arranged on the main circuit board 22 between the second and third element groups G2 and G3. A positive relay terminal 26 is arranged between the fourth and fifth element groups G4 and G5.

A drain conductor pattern for the first element group G1 is electrically connected to the pattern connection electrode portion 27a of the positive input electrode 27. A drain conductor pattern for the fourth and fifth element groups G4 and G5 is electrically connected to the positive input electrode 27 by the positive relay terminal 26. A source conductor pattern for the second and third element groups G2 and G3 is electrically connected to the negative input electrode 28 by the negative relay terminal 25. A source conductor pattern for the sixth element group G6 is electrically connected to the pattern connection electrode portion 28a of the negative input electrode 28.

In addition, a source electrode of the first element group G1 and a drain electrode of the second element group G2 are electrically connected to the base Ua of the U-phase output terminal U. A source electrode of the fourth element group and a drain electrode of the third element group G3 are electrically connected to the base Va of the V-phase output terminal V. A source electrode of the fifth element group G5 and a drain electrode of the sixth element group G6 are electrically connected to the base Wa of the W-phase output terminal W.

As shown in FIGS. 1 and 2, the pattern connection electrode portions 27a and 28a of the positive and negative input electrodes 27 and 28 support a capacitor module 30 so that the capacitor module 30 is located above the main circuit board 22. The capacitor module 30 includes a capacitor board 31 and capacitors 32. The capacitor board 31 generally has the same rectangular shape as the main circuit board 22 and is located above the main circuit board 22.

The capacitors 32 are arranged in correspondence with each of the first element group G1 (U-phase upper-arm element group), the second element group G2 (U-phase lower-arm element group), the third element group G3 (V-phase lower-arm element group), the fourth element group G4 (V-phase upper-arm element group), the fifth element group G5 (W-phase upper-arm element group), and the sixth element group G6 (W-phase lower-arm element group).

The positive terminals of the capacitors 32 are connected to the pattern connection electrode portion 27a of the positive input electrode 27 by the positive conductor pattern. The negative terminals of the capacitors 32 are connected to the pattern connection electrode portion 28a of the negative input electrode 28 by the negative conductor pattern. A support 50, which is made of a synthetic resin, is supported on the main circuit board 22. The support 50 includes a support portion 51, which has the shape of a rectangle plate extending along the longitudinal direction of the main circuit board 22, and two legs 52 extending from the two longitudinal ends of the support portion 51. The legs 52 are coupled to the longitudinal ends of the main circuit board 22, which functions as a coupled subject. The board support portions 27g and 28g of the positive and negative input electrodes 27 and 28 support the support portion 51.

The support portion 51 supports a control circuit board 40, which is also referred to as a substrate. In addition, the board support portions 27g and 28g support the support portion 51 and the control circuit board 40. The control circuit board 40 has a rectangular shape and is generally identical to the support portion 51, the capacitor board 31, and the main circuit board 22. In the semiconductor device 10, the heat sink 11, the main circuit board 22, the capacitor board 31, and the control circuit board 40 are stacked in this order.

Conductive collars 53 are supported on the support portion 51 and located above the board support portions 27g and 28g of the positive and negative input electrodes 27 and 28. The conductive collars 53 are electrically connected to conduction patterns (not shown) of the control circuit board 40 and electrically connect the control circuit board 40 to the positive and negative input electrodes 27 and 28. The control circuit board 40 has an upper surface including a control circuit that includes a plurality of electronic components 41. The control circuit executes switching control on the semiconductor elements 23 to supply power to the vehicle drive motor.

The coupling structure of a current sensor 33 in the semiconductor device 10 will now be described in detail.

Figure 3:
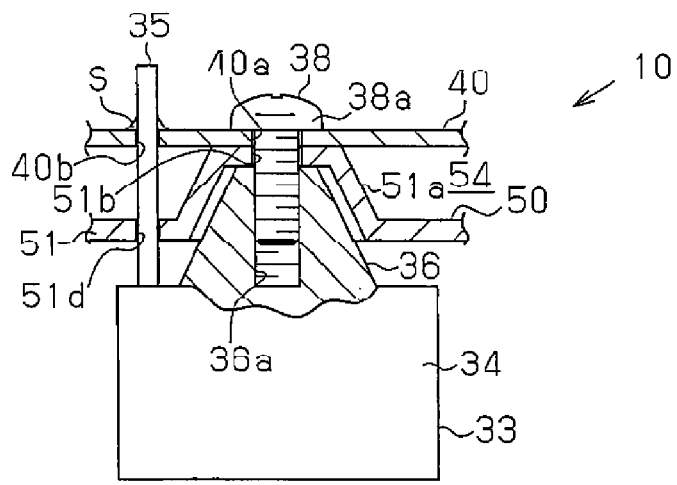
FIG. 3 is a partial cross-sectional view showing the coupling structure of the current sensor of the semiconductor device of FIG. 1.

As shown in FIG. 1, the current sensor 33 includes a case 34, which has a generally box-like shape. Insertion holes 33a extend through the case 34 near the longitudinal ends. Cores (not shown) that surround the insertion holes 33a are arranged in the case 34. Each core includes a void that receives a Hall element. A plurality of signal terminals 35, which output voltage signals of detected current values, extends from the case 34. The signal terminals 35 are located in the longitudinally middle section of the case 34. The longitudinally middle section of the case 34 also includes a coupling boss 36 in the proximity of the signal terminals 35. Thus, in the present embodiment, the coupling boss 36 and the signal terminals 35 are located between the two insertion holes 33a. As shown in FIG. 3, the coupling boss 36 is conical, includes a flat distal end, and has a diameter that decreases toward the distal end. The coupling boss 36 includes a threaded bore 36a, which opens at the central section in the distal end of the coupling boss 36.

As shown in FIG. 2, the current sensor 33 is suspended from the control circuit board 40. The support portion 51 of the support 50 is located between the current sensor 33 and the control circuit board 40. The support 50 includes a conical support boss 51a. The support boss 51a is located between the U-phase output terminal U and the V-phase output terminal V. As shown in FIG. 3, a through bore 51b is formed in central section of the distal end of the support boss 51a. The distance from the upper surface of the support portion 51 to the distal end of the support boss 51a conforms to the axial length of the conductive collars 53. Accordingly, when the control circuit board 40 is supported by the collars 53 on the support portion 51, the conductive collars 53 and the support boss 51a are located between the support portion 51 and the control circuit board 40, and the conductive collars 53 and the support portion 51 form a space 54 between the support portion 51 and the control circuit board 40. In addition, as shown in FIG. 1, a plurality of terminal insertion bores 51d for signal terminals are formed in the support portion 51 near the support boss 51a.

The control circuit board 40 includes a screw bore 40a between the U-phase output terminal U and the V-phase output terminal V. The control circuit board 40 also includes a plurality of terminal connection bores 40b near the screw bore 40a.

As shown in FIG. 3, in the coupling structure of the current sensor 33, the current sensor 33 is arranged under the support portion 51 except for part of the coupling boss 36. Further, and the coupling boss 36 is inserted into the support boss 51a. The signal terminals 35 of the current sensor 33 extend through the terminal insertion bores 51d of the support portion 51 and the terminal connection bores 40b of the control circuit board 40. A screw 38, which functions as a fastener, is inserted through the screw bore 40a of the control circuit board 40 and the insertion bore 51b and fastened to the threaded bore 36a of the coupling boss 36. This integrally fastens together the control circuit board 40, the support portion 51 (support boss 51a), and the current sensor 33 (coupling boss 36). More specifically, the portion of the control circuit board 40 extending around the screw hole 40a and the distal end of the support boss 51a are located between the head 38a of the screw 38 and the distal end of the coupling boss 36.

Accordingly, when the current sensor 33 is coupled, the distal end of the support boss 51a is in planar contact with and pressed against the lower surface of the control circuit board 40, and the distal surface of the coupling boss 36 is in planar contact with and pressed against the inner surface of the support boss 51a. The lower surface of the control circuit board 40 and the upper surface of the support portion 51 define the space 54, which is set in correspondence with the distance between the distal end of the support boss 51a and the upper surface of the support portion 51. In addition, the current sensor 33 is suspended from the control circuit board 40, and the support portion 51 is located between the control circuit board 40 and the current sensor 33. The current sensor 33 is coupled to the control circuit board 40 only by the single screw 38. The support portion 51 and the control circuit board 40 receive the weight of the current sensor 33.

Figure 4:
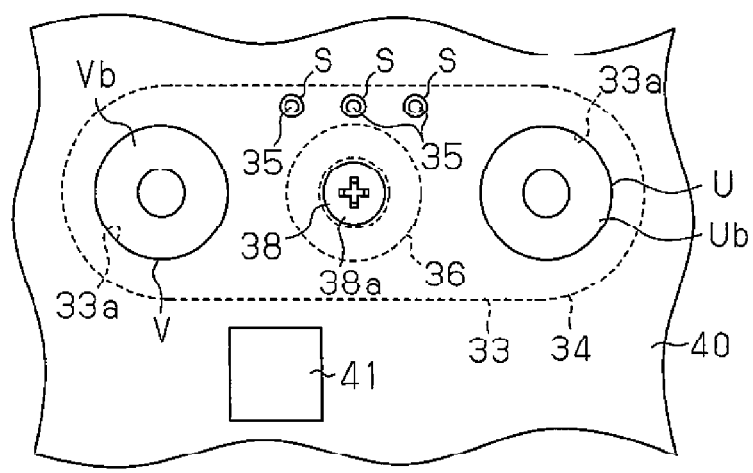
FIG. 4 is a partial plan view showing the coupling structure of the current sensor of FIG. 3.
Figure 5:
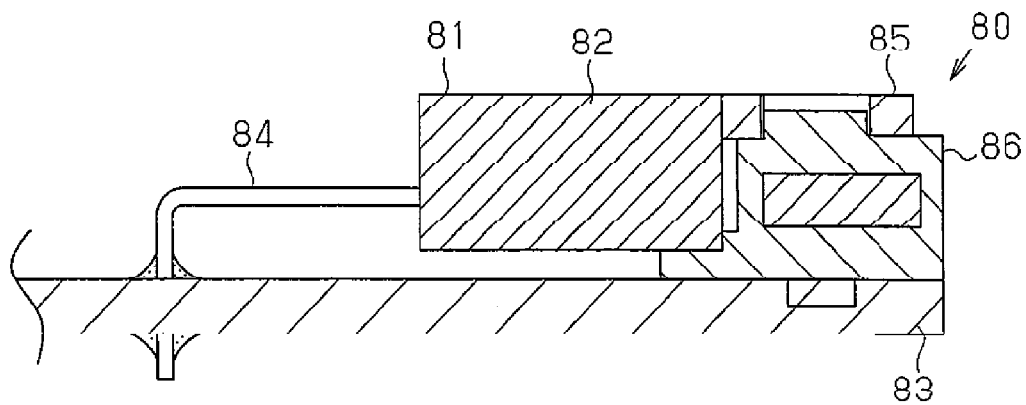
FIG. 5 is a diagram showing the background art.

As shown in FIGS. 3 and 4, the signal terminals 35 of the current sensor 33 extend through the terminal insertion bores 51d of the support portion 51 and the terminal connection bores 40b of the control circuit board 40. Each signal terminal 35 is connected to the control circuit board 40 at a solder connection S around the corresponding terminal connection bore 40b. As shown in FIG. 4, the U-phase output terminal U extends through one of the through holes 33a of the current sensor 33, and the V-phase output terminal V extends through the other through hole 33a. The U-phase output terminal U and the V-phase output terminal V are also referred to as detection subjects. The current sensor 33 detects the values of current flowing through the U-phase output terminal U and the V-phase output terminal V. The detected current values are sent to the control circuit board 40 through the signal terminals 35.

The operation of the semiconductor device 10 will now be described.

In the semiconductor device 10, the current sensor 33 is suspended from the control circuit board 40 and located below the lower surface of the control circuit board 40, instead of being supported on the upper surface of the control circuit board 40. The support portion 51 is arranged between the control circuit board 40 and the current sensor 33. The screw 38 extends through the screw bore 40a of the control circuit board 40 and the support portion 51 and is fastened to the threaded bore 36a of the coupling boss 36 of the current sensor 33. The screw 38 thus couples the current sensor 33 to the control circuit board 40. This eliminates the need for installation space of the current sensor 33 on the control circuit board 40 and allows for the use of the single screw hole 40a. Thus, a greater area on the control circuit board 40 may be used for electronic components and the like compared to when the control circuit board 40 includes installation space of the current sensor 33 and more than one screw 38 is used to couple the current sensor 33 to the control circuit board 40. In addition, the lower surface of the control circuit board 40 and the upper surface of the support portion 51 define the space 54, which is set in correspondence with the distance between the top of the support boss 51a and the upper surface of the support portion 51. The space 54 allows electronic components to be mounted on the lower surface of the control circuit board 40. This increases the mount area for electronic components on the control circuit board 40.

When the semiconductor device 10 is vibrated as the industrial vehicle travels, the vibration is transmitted to the current sensor 33. The control circuit board 40 and the support portion 51 are fastened to each other by the threaded bore 36a of the current sensor 33 and the screw 38. Here, the lower surface of the portion of the control circuit board 40 from which the current sensor 33 is suspended is in planar contact with the support boss 51a. Thus, the support boss 51a of the support portion 51 increases the rigidity of the portion of the control circuit board 40 from which the current sensor 33 is suspended. In addition, vibration of the current sensor 33 is transmitted to the control circuit board 40 in addition to the support portion 51. This disperses the vibration of the current sensor 33 to the support portion 51 and the control circuit board 40 and therefore decreases the vibration of the current sensor 33, the control circuit board 40, and the support portion 51.

The advantages of the present embodiment will now be described.

(1) The screw 38 extends through the control circuit board 40 and the support portion 51 and is fastened to the threaded bore 36a of the current sensor 33. The current sensor 33 is suspended from the control circuit board 40, and the support portion 51 is arranged between the current sensor 33 and the control circuit board 40. This eliminates the need for installation space of the current sensor 33 on the control circuit board 40. Further, the mount area for electronic components and the like on the control circuit board 40 is increased compared to when the current sensor 33 is arranged on the control circuit board 40.

(2) The screw 38 fastens the current sensor 33, the support portion 51, and the control circuit board 40 together. The portion of the control circuit board 40 from which the current sensor 33 is suspended is reinforced by the support boss 51a of the support portion 51, which is in contact with this portion. Accordingly, even when vibration is transmitted to the current sensor 33, the vibration is dispersed to the support portion 51 (support boss 51a) and the control circuit board 40. This decreases the vibration of the current sensor 33. Thus, the solder connections S of the signal terminals 35 of the current sensor 33 are less likely to be affected by vibration and less likely to be damaged.

(3) The support portion 51 is arranged between the control circuit board 40 and the current sensor 33. This reduces vibration and deformation of the control circuit board 40 compared to when the current sensor 33 is suspended from the control circuit board 40 directly and the support portion 51 is not arranged between the current sensor 33 and the control circuit board 40.

(4) The current sensor 33 includes the insertion holes 33a near the longitudinal ends. The coupling boss 36 and the signal terminals 35 are arranged between the insertion holes 33a, and the signal terminals 35 are proximal to the coupling boss 36. In addition, the coupling boss 36 is used to fasten the current sensor 33 to the control circuit board 40 and the support portion 51 with the screw 38. Thus, in the control circuit board 40 and the current sensor 33, the portions near the coupling boss 36, which is engaged with the screw 38, are least susceptible to vibration. The arrangement of the signal terminals 35 adjacent to the coupling boss 36 reduces vibration of the signal terminals 35 and avoids damage of the solder connections S.

(5) The coupling boss 36 is arranged in the longitudinally middle section of the current sensor 33. Thus, the current sensor 33 is well-balanced when suspended from the control circuit board 40, and the fastening requires only the single coupling boss 36. A pattern is not arranged around the screw bore 40a on the control circuit board 40. Thus, the use of the single bore 40a allows for a greater mount area on the control circuit board 40.

(6) The single screw 38 fastens the current sensor 33 to the control circuit board 40. This facilitates the installation of the current sensor 33 compared to when more than one screw 38 is used to fasten the current sensor 33 to the control circuit board 40.

(7) The support portion 51 is made of a synthetic resin, and the support boss 51a is formed integrally with the support portion 51. This facilitates the fastening of the current sensor 33 with the screw 38 compared to when the support boss 51a is discrete from the support portion 51.

(8) When the control circuit board 40, the support boss 51a, and the coupling boss 36 are fastened together, the coupling boss 36, which projects from the current sensor 33, is inserted in the support boss 51a, which projects from the support portion 51 of the support 50. In addition, the support boss 51a separates the lower surface of the control circuit board 40 from the upper surface of the support portion 51. Unlike a structure that lacks the support boss 51a and has the entire lower surface of the control circuit board 40 in contact with the entire upper surface of the support portion 51, the lower surface of the control circuit board 40 and the upper surface of the support portion 51 define the space 54 where electronic components and the like can be arranged. Thus, electronic components can be mounted on the lower surface of the control circuit board 40. This increases the mount area for electronic components on the control circuit board 40.

It should be apparent to those skilled in the art that the present invention may be embodied in many other specific forms without departing from the spirit or scope of the invention. Particularly, it should be understood that the present invention may be embodied in the following forms.

In the present embodiment, the current sensor 33 includes the coupling boss 36 and the signal terminals 35, which are located between the insertion holes 33a. However, the positions of the coupling boss 36 and the signal terminals 35 may be varied.

In the present embodiment, the current sensor 33 includes two insertion holes 33a and three signal terminals 35. However, the numbers of the insertion holes 33a and the signal terminals 35 may be varied depending on the detection subject.

In the present embodiment, the support portion 51 includes the support boss 51a that is arranged between the control circuit board 40 and the current sensor 33. However, the support boss 51a may be omitted.

In the present embodiment, the coupling boss 36 of the current sensor 33 includes the threaded bore 36a that is engaged with the screw 38. However, the present invention is not limited to this structure. For example, a screw portion may project from the distal end of the coupling boss 36. The screw portion may be inserted through the support boss 51a and the screw bore 40a and fastened to a threaded portion of a fastener such as a nut or a cap nut.

In the present embodiment, the support boss 51a and the coupling boss 36 are conical. However, the support boss 51a and the coupling boss 36 may be of any shape including a four-sided pyramid, a three-sided pyramid, and a cylinder.

The semiconductor device 10 is not limited to industrial vehicles and may be used with automobiles, household electric appliances, and industrial machines.

The numbers of the semiconductor elements 23 and the capacitors 32 may be varied, and the sizes of the main circuit board 22 and the capacitor board 31 may be varied corresponding to the numbers of the semiconductor elements 23 and the capacitors 32.

The semiconductor device 10 is not limited to inverter circuits and may be used with DC-DC converters.

In the present embodiment, the main circuit board 22 functions as the coupled subject for the support 50. However, the support 50 may be coupled to any portion.

Therefore, the present examples and embodiments are to be considered as illustrative and not restrictive and the invention is not to be limited to the details given herein, but may be modified within the scope and equivalence of the appended claims.

The invention claimed is:

1. An electronic device comprising:
a support that is coupled to a coupled subject and includes a plate-shaped support portion;
a control circuit board supported by the support portion;
a current sensor including a signal terminal, wherein the current sensor is connected to the control circuit board in a manner allowing for a signal to be sent to the control circuit board through the signal terminal; and
a fastener extending through the control circuit board and through the support portion to the current sensor so as to fasten together the current sensor, the support portion and the control circuit board, wherein
the current sensor is suspended from the control circuit board, and
the support portion is arranged between the control circuit board and the current sensor.

2. The electronic device according to claim 1, wherein
the support portion includes a support boss projecting toward the control circuit board,
the current sensor includes a coupling boss that is inserted into the support boss, and
the fastener extends through the control circuit board and the support boss and is fastened to the coupling boss.

3. The electronic device according to claim 2, wherein the support boss is formed integrally with the support portion.

4. The electronic device according to claim 2, wherein
the current sensor includes a plurality of insertion holes through which a detection subject extends, and
the coupling boss and the signal terminal are arranged between adjacent ones of the insertion holes.

5. The electronic device according to claim 1, further comprising a semiconductor element, wherein the control circuit board controls the semiconductor element.

6. An electronic device comprising:
a support that is coupled to a coupled subject and includes a plate-shaped support portion;
a control circuit board supported by the support portion;
a current sensor that includes a signal terminal and is connected to the control circuit hoard in a manner allowing for a signal to be sent to the control circuit board through the signal terminal; and
a fastener fastening the current sensor to the support portion and the control circuit board, wherein
the current sensor is located below the control circuit board, and
the support portion is arranged between the control circuit board and the current sensor.

7. The electronic devise according to claim 1, wherein the support includes a leg extending from the support portion and configured to be coupled to the coupled subject.

8. The electronic devices according to claim 6, wherein the support includes a leg extending from the support portion and configured to be coupled to the coupled subject.

* * * * *